(12) United States Patent
Heinz

(10) Patent No.: US 7,592,705 B2
(45) Date of Patent: Sep. 22, 2009

(54) METHOD AND APPARATUS FOR STRAPPING TWO POLYSILICON LINES IN A SEMICONDUCTOR INTEGRATED CIRCUIT DEVICE

(75) Inventor: Michael James Heinz, Livermore, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 427 days.

(21) Appl. No.: 11/599,654

(22) Filed: Nov. 14, 2006

(65) Prior Publication Data

US 2008/0111246 A1    May 15, 2008

(51) Int. Cl.
*H01L 23/528* (2006.01)
(52) U.S. Cl. .............................. 257/775; 257/E23.164; 257/754; 257/773
(58) Field of Classification Search .................. 257/775, 257/E23.164, 754, 773
See application file for complete search history.

(56) References Cited

U.S. PATENT DOCUMENTS 6,455,942 B1 * 9/2002 Nguyen ........................ 257/775

OTHER PUBLICATIONS

Lin, et al., "Signal Delay In General RC Networks," IEEE Transactions On Computer-Aided Design, vol. CAD-3, No. 4, Oct. 1984, pp. 331-349.

Renault, et al., "Splitting of RC-Network For Accurate Model Reduction," IEEE, 2004, pp. 734-737.

Chan, et al., "Computing Signal Delay In General RC Networks By Tree/Link Partitioning," 26th ACM/IEEE Design Automation Conference, 1989, pp. 485-490.

* cited by examiner

*Primary Examiner*—Evan Pert
*Assistant Examiner*—Krista Soderholm
(74) *Attorney, Agent, or Firm*—DLA Piper LLP (US)

(57) ABSTRACT

A method and apparatus for partially strapping two polysilicon lines, each having a first end and second end, uses a metal line having a plurality of spaced apart metal segments with each metal segment partially strapping a different portion of a polysilicon line. The metal segments are arranged from the first end to the second end with the signals propagating from the second end to the first end. Where two metal segments are used, the segments have lengths of $$x = \frac{2L}{\sqrt{7}}$$

and L−X where L is the length between the first end and the second end. Where three segments are used, the segments have lengths of X=0.25L, Y=0.48L, and Z=0.27L.

16 Claims, 2 Drawing Sheets

METHOD AND APPARATUS FOR STRAPPING TWO POLYSILICON LINES IN A SEMICONDUCTOR INTEGRATED CIRCUIT DEVICE

TECHNICAL FIELD

The present invention relates to a metal line having a plurality of segments to partially strap a different portion of two polysilicon lines in a semiconductor integrated circuit device.

BACKGROUND OF THE INVENTION

Semiconductor integrated circuit devices are well known in the art. In particular, in the field of memory devices, including both volatile (such as DRAM or SRAM) as well as non-volatile (such as FLASH), a plurality of polysilicon lines are used as row lines to access various memory cells. Because these row lines are made out of polysilicon, they tend to have higher resistivity than conductors made out of metal. Thus, metal lines are used to "strap" various polysilicon lines. By strapping it is meant to connect a metal line in parallel with the polysilicon row line to reduce the resistivity of the polysilicon row line.

As the scale of integration increases, i.e., the smallest dimension of a feature in a semiconductor integrated circuit device decreases, the width of the polysilicon lines will also decrease. However, the scale of integration for metal lines has not kept pace at the same rate as the scale of integration for other features such as the polysilicon lines. In other words, the width of the metal strapping lines has not been reduced at the same rate as the width of the polysilicon lines.

Thus, a metal line having a width greater than a plurality of polysilicon lines, may be segmented into a plurality of metal segments with each metal segment used to strap a different portion of the polysilicon lines.

The present invention deals with the optimal position for the strapping of such a partial strapped polysilicon line. U.S. Pat. No. 6,455,942 discloses one such technique, and its disclosure is incorporated herein by reference in its entirety. However, U.S. Pat. No. 6,455,942 deals with the problem of partial strapping by modeling the polysilicon lines as purely resistive loads without any capacitance.

Using the delay of Elmore technique to solve the problem of delay in RC networks has been know in the prior art. See, for example, "Signal Delay in General RC Networks" by Tzu-Mu Lin and Carver Mead, *IEEE Transactions on Computer Aided Design*, vol. CAD-3, No. 4, October 1984 (pp. 331-349); "Splitting of RC Network for Accurate Model Reduction" by Patricia Renault and Pirouz Bazargan-Sabet, *IEEE*, 2004 (pp. 734-737); and "Computing Signal Delay in General RC Networks by Tree/Link Partitioning" by Pak K. Chan and Kevin Karplus, *26th ACM/IEEE Design Automation Conference*, 1989 (pp. 485-490).

SUMMARY OF THE INVENTION

In the present invention, a semiconductor integrated circuit device comprises a semiconductor substrate with a plurality of circuits in the semiconductor substrate. Two substantially parallel, laterally adjacent spaced part polysilicon lines, are insulated from the substrate and interconnect the plurality of circuits. Each of the plurality of polysilicon lines has a first end and a second end and has substantially the same length between the first end and the second end with electrical signals traversing from the second end to the first end. A metal line, spaced apart from the plurality of polysilicon lines, has two segments, with each segment having a length and wherein collectively the length of the two segments is substantially the length from the first end to the second end. Each segment of the metal line electrically connects to a different one of the two polysilicon lines. The metal line is arranged from the first end to the second end, with one of the two segments having a length substantially of $$x = \frac{2L}{\sqrt{7}}$$

and with the other segment having the length of L–X where L is the length between the first end and the second end.

The present invention also relates to a semiconductor integrated circuit device having two substantially parallel, laterally adjacent spaced part polysilicon lines, and strapped by a metal line having three segments. Finally, the present invention also relates to a method of forming such structures.

DETAILED DESCRIPTION OF THE INVENTION

Figure 1:
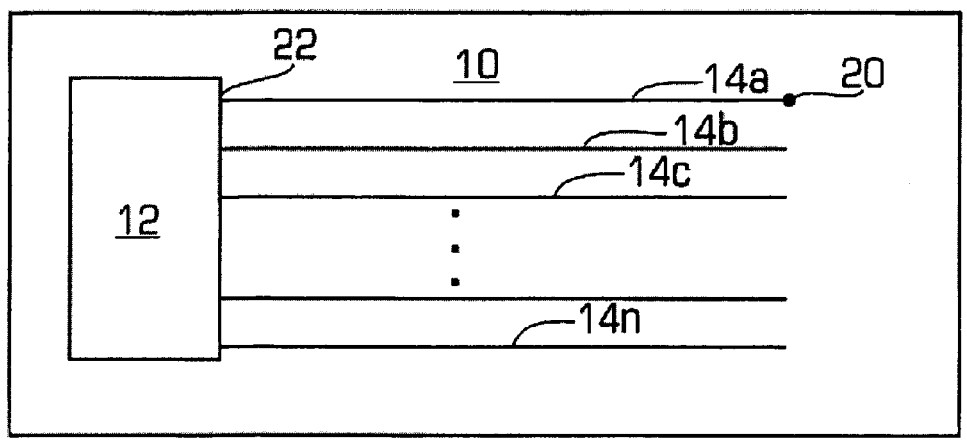
FIG. 1 is a top view of an integrated circuit device with a plurality of substantially parallel polysilicon lines to which the method and apparatus of the present invention can be applied.

Referring to FIG. 1, there is shown a top level view of a semiconductor integrated circuit device 10 to which the method and apparatus of the present invention can be applied. The semiconductor integrated circuit device 10 comprises a semiconductor substrate in which a plurality of circuits 12 are formed. A plurality of substantially parallel laterally adjacent spaced apart polysilicon lines 14(*a-n*) are formed above and insulated from the substrate. They interconnect the plurality of circuits 12. Each of the plurality of polysilicon lines 14(*a-n*) has a second end 20 and a first end 22 with substantially the same length between the first end 22 and the second end 20 with electrical signals traversing from the second end 20 to the first end 22.

In the preferred embodiment, the integrated circuit device 10 is a memory device in which the plurality of circuits 12 are row decoders. The plurality of polysilicon lines 14(*a-n*) are word lines or row lines. The semiconductor integrated circuit device 10 can be a volatile memory device such as a DRAM or an SRAM or can be a non-volatile memory device such as a FLASH memory device or an EEPROM device.

Figure 2:
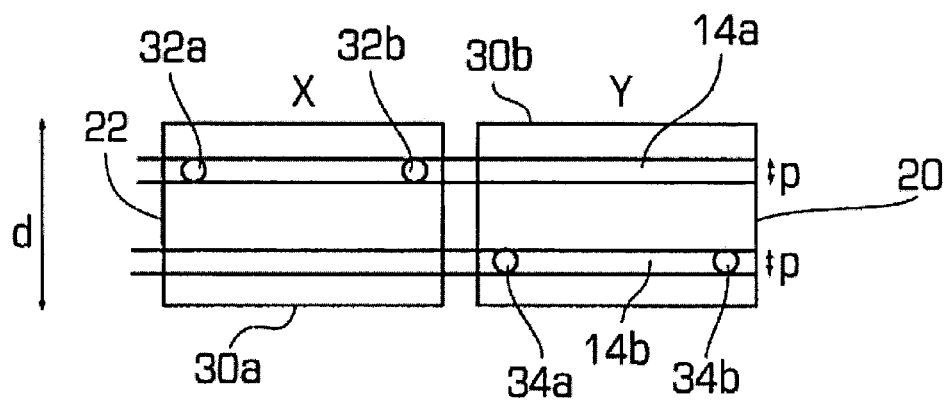
FIG. 2 is a top view of a first embodiment of the present invention in which a metal line, having two segments, straps two polysilicon lines.

Referring to FIG. 2, there is shown a first embodiment of the present invention in which a single metal line 30 is used to strap two adjacent spaced-apart polysilicon lines 14*a* and 14*b*. The metal line 30 comprises two spaced apart segments 30A and 30B that are collinear and have a width of a dimension d. As previously stated, each of the polysilicon lines 14*a* and 14*b* has a first end 22 and a second end 20 and a length therebetween with each having a width of a dimension P, with P less than d. In fact, d overlaps the distance between the two polysilicon lines 14a and 14b as well as including their widths P.

As previously stated, the metal line 30 has two segments 30a and 30b having a length of x and y respectively. Each of the lengths x and y is used to strap and is connected to a different one of the polysilicon lines 14a or 14b. Thus, the metal segment 30a is used to strap polysilicon line 14a through via holes 32a and 32b. The metal segment 30b is used to strap polysilicon line 14b through the via holes 34a and 34b.

Figure 3:
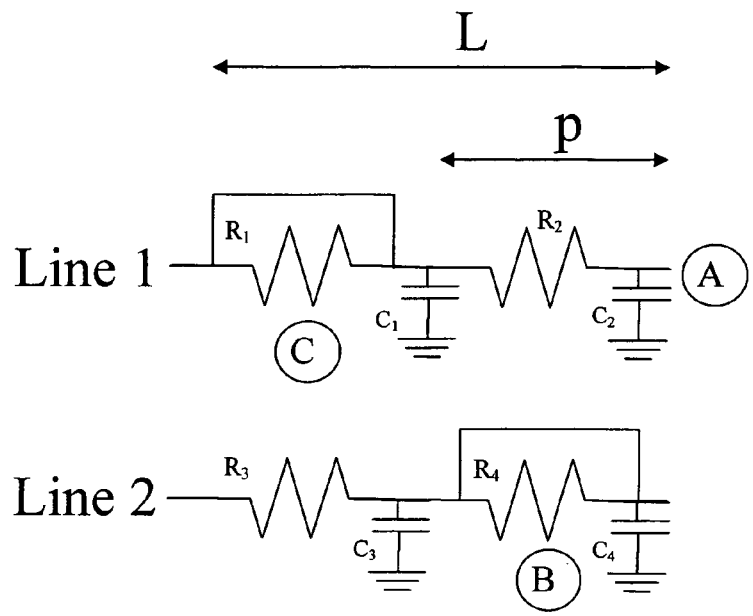
FIG. 3 is a schematic view of the first embodiment shown in FIG. 2

Schematically this is shown in FIG. 3. Polysilicon line 1 extends from the first end 22 to the second end 20 through a line having resistance, R1 and R2, as shown by the waviness of the line in FIG. 3. However, between the via holes 32a and 32b, the metal segment 30a having a length of L−p straps the polysilicon line 14a. There is essentially no resistance between the location of the via hole 32a and 32b. Each segment of the polysilicon line 1, e.g. the segment between the via holes 32a and 32b, the polysilicon line has a resistance of R1 and a capacitance of C1.

Similarly, the polysilicon line 14b is shown as being "wavy" indicating that it has a resistance, R3 and R4, between the first end 22 and the second end 20. However, between the via hole 34a and 34b the metal segment 30b having a length of p is used to strap the polysilicon line 14b. Similar to the foregoing discussion for the polysilicon line 1, each segment of the polysilicon line 2 also has an associated resistance R3 and R4 and an associated capacitance, C3 and C4. Finally, one expects that the resistance of R1 to be the same as the resistance of R3 since the polysilicon segments would be virtually identical in length and width. Similarly, one expects R2=R4, and C1=C3, and C2=C4.

Thus, each of the polysilicon lines 1 and 2 may be viewed as having a plurality of lumped resistances, as shown in FIG. 3, where L is the total length of the polysilicon line, p is the length of the un-strapped portion of the polysilicon line 1, and nodes A, B, and C are the points of critical interest that will take the longest time to charge. Nodes B and C represent the midpoints of the strapped segments, while node A represents the endpoint of the array.

The following identity can be used to apply the delay of Elmore technique to the delay for each of these nodes.

$$\sum_{i=1}^{n} i = \frac{1}{2}n^2 + \frac{1}{2}n \quad (1)$$

The delays at nodes A and B may be computed as follows.
Delay at Node A:

$$t_{dA}/RC = p + (p-1) + \ldots + 2 + 1 = \frac{1}{2}p^2 + \frac{1}{2}p \quad (2)$$

Delay at Node B:

$$t_{dB}/RC = L + (L-1) + \ldots + (p+1) + \left(\frac{p}{2}\right) + \quad (3)$$
$$\left(\frac{p}{2} - 1\right) + \ldots + 2 + 1$$

-continued
$$= \frac{1}{2}L^2 + \frac{1}{2}L - \frac{3}{8}p^2 - \frac{1}{4}p.$$

To balance and minimize these delays we set $t_{dA}=t_{dB}$ to get $$\frac{1}{2}L^2 + \frac{1}{2}L - \frac{3}{8}p^2 - \frac{1}{4}p = \frac{1}{2}p^2 + \frac{1}{2}p \quad (4)$$

$$\Rightarrow p^2 + \frac{6}{7}p + \frac{4}{7}(-L^2 - L) = 0$$

$$\Rightarrow p = -\frac{3}{7} \pm \sqrt{\frac{9}{49} + \frac{4}{7}(L^2 + L)}$$

or, for large L and choosing the positive root, $$p \cong \frac{2}{\sqrt{7}}L \cong 0.76L.$$

As can be seen, the foregoing result is independent of the value of the resistance R or the capacitance C, and based upon simulation, the result yields an approximate 24% improvement over the technique disclosed in U.S. Pat. No. 6,455,942, which assumes the polysilicon segments are only resistive segments.

Figure 4:
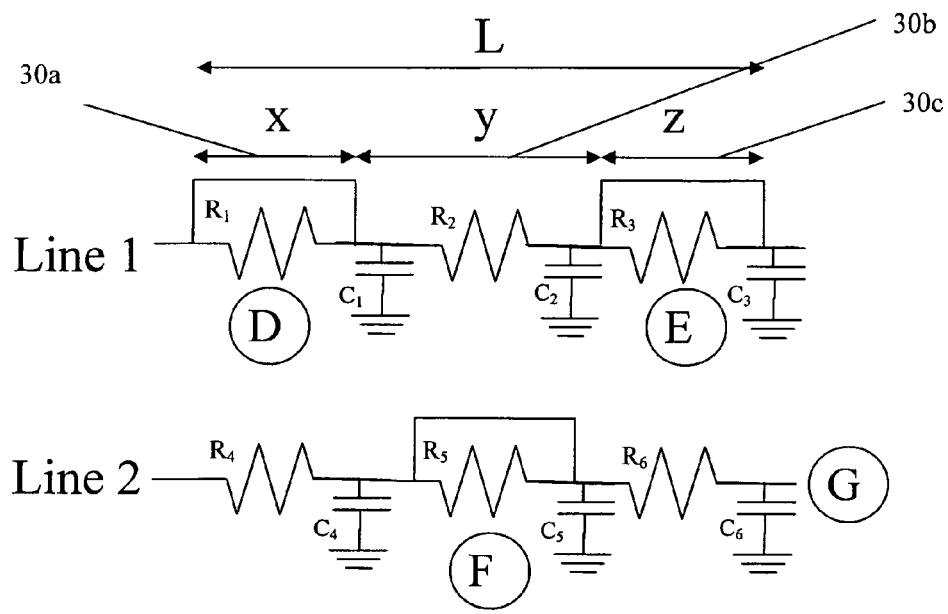
FIG. 4 is a schematic view of a second embodiment of the present invention in which a metal line, having three segments, straps two polysilicon lines.

Referring to FIG. 4 there is shown another embodiment of the present invention. In the embodiment shown in FIG. 4, two polysilicon lines, 1 and 2, are strapped by a metal line 30, having three segments: 30a, 30b, and 30c. The metal segment 30a straps the portion of polysilicon line 1 over the length x, which is closest to the first end 22, and the metal segment 30c straps the portion of polysilicon line 1 over the length z, which is closest to the second end 20. The metal segment 30b, which is between the segments 30a and 30c, straps the portion of the polysilicon line 2 over the length y, which is between the lengths x and z. Each of the polysilicon lines (1 or 2) over the segments x, y, or z, has an associated resistance and an associated capacitance, as shown in FIG. 4. In reality, because the segment x is the same for polysilicon 1 and polysilicon 2, R1=R4 and C1=C4. Similarly R2=R5, and C2=C5. Finally, R3=R6 and C3=C6. The embodiment shown in FIG. 4 is advantageous to further reduce the delay in the worst case delay by using additional strapping segments. Nodes D, E, and F are the midpoints of the strapped segments with x, z, and y RC-stages respectively, whereas node G is a node at the second end 20.

Applying the delay of Elmore technique to the delay for each of these nodes, as before, one finds that the delay for the critical nodes D, E, F, and G are found to be:

Delay at Node D:

$$t_{dD}/RC = \frac{1}{2}\left(\frac{x}{2}\right)^2 + \frac{1}{2}\left(\frac{x}{2}\right)$$
$$= \frac{1}{8}x^2 + \frac{1}{4}x \quad (10)$$

Delay at Node E:

$$t_{dE}/RC = \frac{1}{2}(L-x)^2 + \frac{1}{2}(L-x) - \frac{1}{2}z^2 - \frac{1}{2}z + \frac{1}{2}\left(\frac{z}{2}\right)^2 + \frac{1}{2}\left(\frac{z}{2}\right) \ (x = L - y - z)$$
$$= \frac{1}{2}y^2 + \frac{1}{2}y + \frac{1}{8}z^2 + \frac{1}{4}z + yz \quad (11a)$$

Delay at Node F:

$$t_{dF}/RC = \frac{1}{2}L^2 + \frac{1}{2}L - \frac{1}{2}(y+z)^2 - \frac{1}{2}(y+z) + \frac{1}{2}\left(\frac{y}{2}\right)^2 + \frac{1}{2}\left(\frac{y}{2}\right)$$
$$= \frac{1}{2}L^2 + \frac{1}{2}L - \frac{3}{8}y^2 - \frac{1}{4}y - \frac{1}{2}z^2 - \frac{1}{2}z - yz \quad (11b)$$

Delay at Node G:

$$t_{dG}/RC = \frac{1}{2}L^2 + \frac{1}{2}L - \frac{1}{2}(y+z)^2 - \frac{1}{2}(y+z) + \frac{1}{2}z^2 + \frac{1}{2}z$$
$$= \frac{1}{2}L^2 + \frac{1}{2}L - \frac{1}{2}y^2 - \frac{1}{2}y - yz \quad (11c)$$

Comparing sums shows that $t_{dD} < t_{dF}$ and $t_{dD} < t_{dG}$, so that $t_{dD}$ cannot be the node with worst case delay. To simplify analysis of the remaining nodes, replace x, y and z with x', y' and z', such that x=x'L, y=y'L and z=z'L, and therefore 0<x', y', z'<1 and x'+y'+z'=1. Then equations (11(a-c)) become $$t_{dE}/RC = \frac{1}{2}y'^2L^2 + \frac{1}{2}y'L + \frac{1}{8}z'^2L^2 + \frac{1}{4}z'L + y'z'L^2 \quad (12)$$
$$t_{dF}/RC = \frac{1}{2}L^2 + \frac{1}{2}L - \frac{3}{8}y'^2L^2 - \frac{1}{4}y'L - \frac{1}{2}z'^2L^2 - \frac{1}{2}z'L - y'z'L^2$$
$$t_{dG}/RC = \frac{1}{2}L^2 + \frac{1}{2}L - \frac{1}{2}y'^2L^2 - \frac{1}{2}y'L - y'z'L^2.$$

If L is large (the RC network is finely partitioned) then finding a segmentation that minimizes the loads across the three nodes of equations (12) is approximately equivalent to finding the y' and z' values which balance the following set of equations, where only terms proportional to $L^2$ have been retained, and where $t'_{dx} = t_{dx}L^2$.

$$t'_{dE}/RC = \frac{1}{2}y'^2 + \frac{1}{8}z'^2 + y'z' \quad (13)$$

$$t'_{dF}/RC = \frac{1}{2} - \frac{3}{8}y'^2 - \frac{1}{2}z'^2 - y'z'$$

$$t'_{dG}/RC = \frac{1}{2} - \frac{1}{2}y'^2 - y'z'$$

Numerical analysis of equations (13) shows that the ratio of three segments for minimizing delay at the three critical nodes is approximately given by x=0.25L y=0.48L z=0.27L.

From the foregoing and simulation, it can be seen that the ideal strapping ratios using three metal segments are also independent of the resistance and capacitance. Further, improvement to the embodiment shown in FIGS. 2 and 3 is approximately 8%. Finally, by modeling the polysilicon lines as having both resistance and capacitance, improvement of the disclosure in U.S. Pat. No. 6,455,942 is also achieved.

What is claimed is:

1. A semiconductor integrated circuit device comprising:
a semiconductor substrate;
a plurality of circuits in said semiconductor substrate;
two substantially parallel, laterally adjacent spaced part polysilicon lines, insulated from said substrate and interconnecting said plurality of circuits; each of said plurality of polysilicon lines having a first end and a second end and having substantially the same length between said first end and said second end with electrical signals traversing from said second end to said first end;
a metal line, spaced apart from said plurality of polysilicon lines, having two segments, with each segment having a length and wherein collectively the length of said two segments is substantially the length from said first end to said second end;
each segment of said metal line for electrically connecting to a different one of said two polysilicon lines;
said metal line arranged from said first end to said second end, with one of the two segments having a length substantially of $$x = \frac{2L}{\sqrt{7}}$$

and with the other segment having the length of L−X where L is the length between said first end and said second end.

2. The device of claim 1 wherein said integrated circuit device is a memory device.

3. The device of claim 2 wherein said plurality of polysilicon lines are row lines.

4. The device of claim 3 wherein said device is a volatile memory device.

5. The device of claim 4 wherein said device is a DRAM.

6. The device of claim 4 wherein said device is a SRAM.

7. The device of claim 3 wherein said device is a nonvolatile memory device.

8. The device of claim 7 wherein said device is a flash memory device.

9. A semiconductor integrated circuit device comprising:

a semiconductor substrate;

a plurality of circuits in said semiconductor substrate;

two substantially parallel, laterally adjacent spaced part polysilicon lines, insulated from said substrate and interconnecting said plurality of circuits; each of said plurality of polysilicon lines having a first end and a second end and having substantially the same length between said first end and said second end with electrical signals traversing from said second end to said first end;

a metal line, spaced apart from said plurality of polysilicon lines, having three segments, with each segment having a length and wherein collectively the length of said three segments is substantially the length from said first end to said second end;

each segment of said metal line for electrically connecting to a different portion of one of the two polysilicon lines;

said metal line arranged from said first end to said second end, with the length of the segments substantially $X = 0.25L$ $Y = 0.48L$ $Z = 0.27L$ where L is the length between said first end and said second end.

10. The device of claim 9 wherein said integrated circuit device is a memory device.

11. The device of claim 10 wherein said plurality of polysilicon lines are row lines.

12. The device of claim 11 wherein said device is a volatile memory device.

13. The device of claim 12 wherein said device is a DRAM.

14. The device of claim 12 wherein said device is a SRAM.

15. The device of claim 11 wherein said device is a nonvolatile memory device.

16. The device of claim 15 wherein said device is a flash memory device.

* * * * *